US010715121B2

(12) United States Patent
Singh et al.

(10) Patent No.: US 10,715,121 B2
(45) Date of Patent: Jul. 14, 2020

(54) PARAMETER-INDEPENDENT RAMP SIGNAL GENERATION

(71) Applicant: Cirrus Logic International Semiconductor Ltd., Edinburgh (GB)

(72) Inventors: Saurabh Singh, Cedar Park, TX (US); Vamsikrishna Parupalli, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/431,320

(22) Filed: Jun. 4, 2019

(65) Prior Publication Data

US 2019/0379367 A1 Dec. 12, 2019

Related U.S. Application Data

(60) Provisional application No. 62/683,355, filed on Jun. 11, 2018.

(51) Int. Cl.
*H03K 4/50* (2006.01)
*H03H 11/04* (2006.01)

(52) U.S. Cl.
CPC .............. *H03K 4/50* (2013.01); *H03H 11/04* (2013.01)

(58) Field of Classification Search
CPC ........... H03K 4/50; H03K 4/502; H03H 11/04
See application file for complete search history.

(56) References Cited

U.S. PATENT DOCUMENTS 9,331,683 B2 * 5/2016 Yoo ........................ H03K 4/08

* cited by examiner

*Primary Examiner* — Jung Kim
(74) *Attorney, Agent, or Firm* — Jackson Walker L.L.P.

(57) ABSTRACT

A system may include a ramp generation circuit for generating a ramp waveform and comprising a first passive circuit element having an impedance pertinent to generation of the ramp waveform and a control circuit comprising a second passive circuit element which is impedance-correlated to the first passive circuit element. The control circuit may be configured to use the second passive circuit element to generate a control signal for controlling the ramp generation circuit, such that a correlation between the first passive circuit element and the second passive circuit element substantially cancels physical variations of the first passive circuit element and the second passive circuit element and use a control signal clock for generating the control signal that is related to a ramp generation clock for generating the ramp waveform such that a magnitude of the ramp waveform remains substantially independent of frequency of operation.

10 Claims, 2 Drawing Sheets

PARAMETER-INDEPENDENT RAMP SIGNAL GENERATION

RELATED APPLICATION

The present disclosure claims priority to U.S. Provisional Patent Application Ser. No. 62/683,355, filed Jun. 11, 2018, which is incorporated by reference herein in its entirety.

FIELD OF DISCLOSURE

The present disclosure relates in general to circuits for electronic devices, and more specifically, to a ramp generation circuit that provides for parameter-independent ramp signal generation.

BACKGROUND

Numerous devices, including without limitation personal audio devices, wireless telephones, such as mobile/cellular telephones, cordless telephones, mp3 players, and other consumer audio devices, often use one or more ramp generation circuits. In operation, such ramp generation circuits produce a periodic signal that, during each periodic cycle, ramps from a minimum magnitude (e.g., zero) to a maximum magnitude. In some instances, a ramp signal generated by a ramp-generation circuit may be used by a pulse-width modulator to generate a pulse-width modulated signal, as is known in the art.

FIG. 1 depicts an example ramp-generation circuit 100, as is known in the art. As shown in FIG. 1, ramp-generation circuit 100 may include a reference-current generation sub-circuit 102 for generating a reference current $I_{ref}=V_{ref}/R_{trim}$, where $V_{ref}$ is a reference voltage and $R_{trim}$ is a resistance of a resistor 104 of reference-current generation subcircuit 102. Ramp-generation circuit 100 may also include a current-mirror stage 106 that sources an amplifier input current proportional to reference current $I_{ref}$ to a positive input terminal of output amplifier stage 108 and sinks an amplifier input current of identical magnitude from a negative input terminal of output amplifier stage 108. Such amplifier input currents may flow through feedback capacitors 110 of equal capacitance, integrating charge during each cycle of ramp-generation circuit 100 to generate, at each output terminal of output amplifier stage 108, a sawtooth ramp signal, which is reset to its minimum voltage (e.g., zero) during each cycle boundary of ramp-generation circuit 100 as a result of periodic activation of switches 112 by clock signal CLK.

Ramp-generation circuit 100 of FIG. 1 may have numerous disadvantages. For instance, the resistance $R_{trim}$ of resistor 104 may require trimming to account for process variations of ramp-generation circuit 100, which adds cost and design complexity to ramp-generation circuit 100. Ramp-generation circuit 100 may also be unable to track changes in frequency, temperature, and/or supply voltage.

SUMMARY

In accordance with the teachings of the present disclosure, one or more disadvantages and problems associated with existing approaches to generating a ramp signal may be reduced or eliminated.

In accordance with embodiments of the present disclosure, a system may include a ramp generation circuit for generating a ramp waveform and comprising a first passive circuit element having an impedance pertinent to generation of the ramp waveform and a control circuit comprising a second passive circuit element which is impedance-correlated to the first passive circuit element. The control circuit may be configured to use the second passive circuit element to generate a control signal for controlling the ramp generation circuit, such that a correlation between the first passive circuit element and the second passive circuit element substantially cancels physical variations of the first passive circuit element and the second passive circuit element and use a control signal clock for generating the control signal that is related to a ramp generation clock for generating the ramp waveform such that a magnitude of the ramp waveform remains substantially independent of frequency of operation.

In accordance with these and other embodiments of the present disclosure, a method may include generating a ramp waveform with a ramp generation circuit, the ramp generation circuit comprising a first passive circuit element having an impedance pertinent to generation of the ramp waveform, using a passive circuit element which is impedance-correlated to the first passive circuit element to generate a control signal for controlling the ramp generation circuit, such that a correlation between the first passive circuit element and the second passive circuit element substantially cancels physical variations of the first passive circuit element and the second passive circuit element, and using a control signal clock for generating the control signal that is related to a ramp generation clock for generating the ramp waveform such that a magnitude of the ramp waveform remains substantially independent of frequency of operation.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
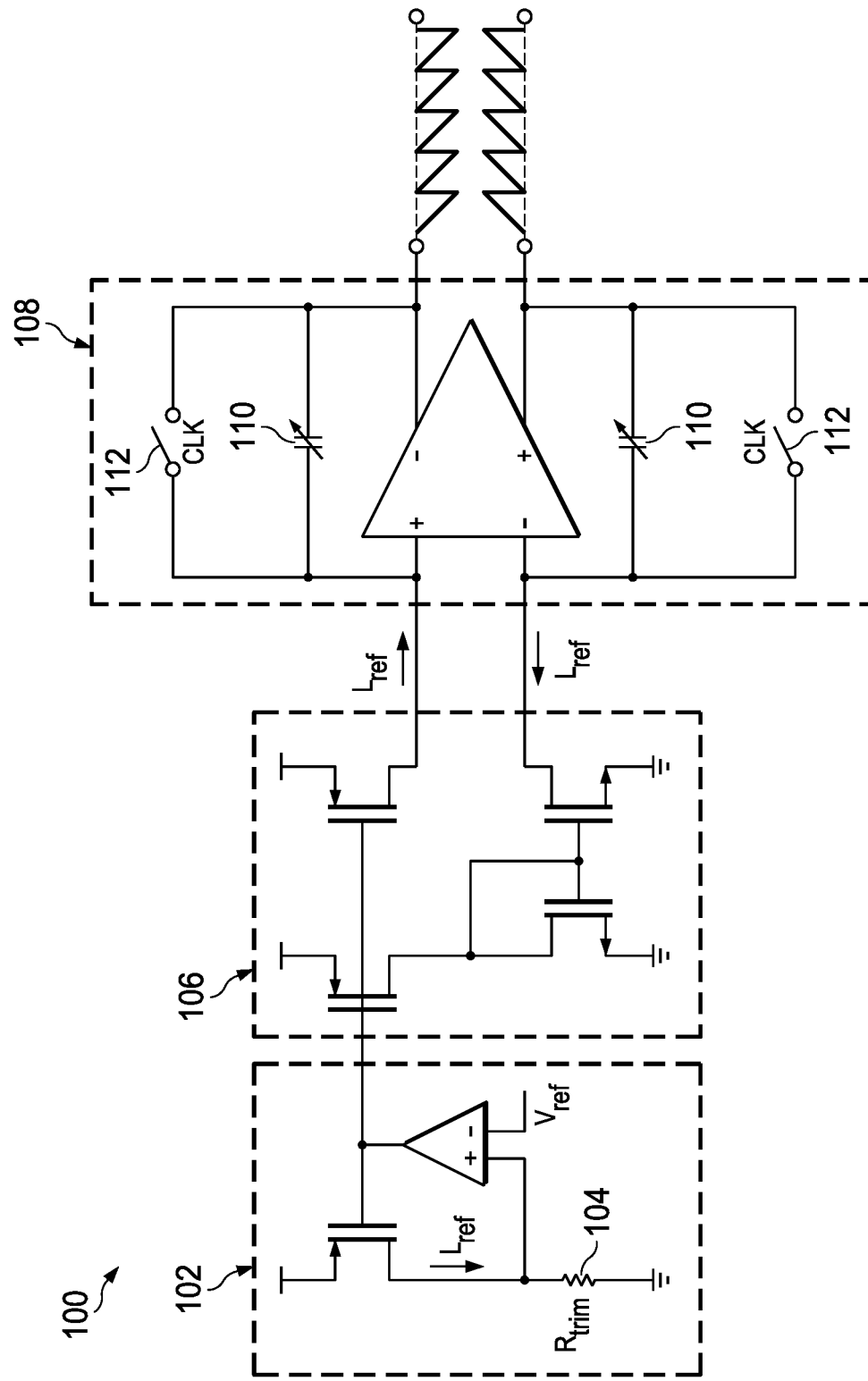
FIG. 1 illustrates an example ramp-generation circuit, as is known in the art.
Figure 2:
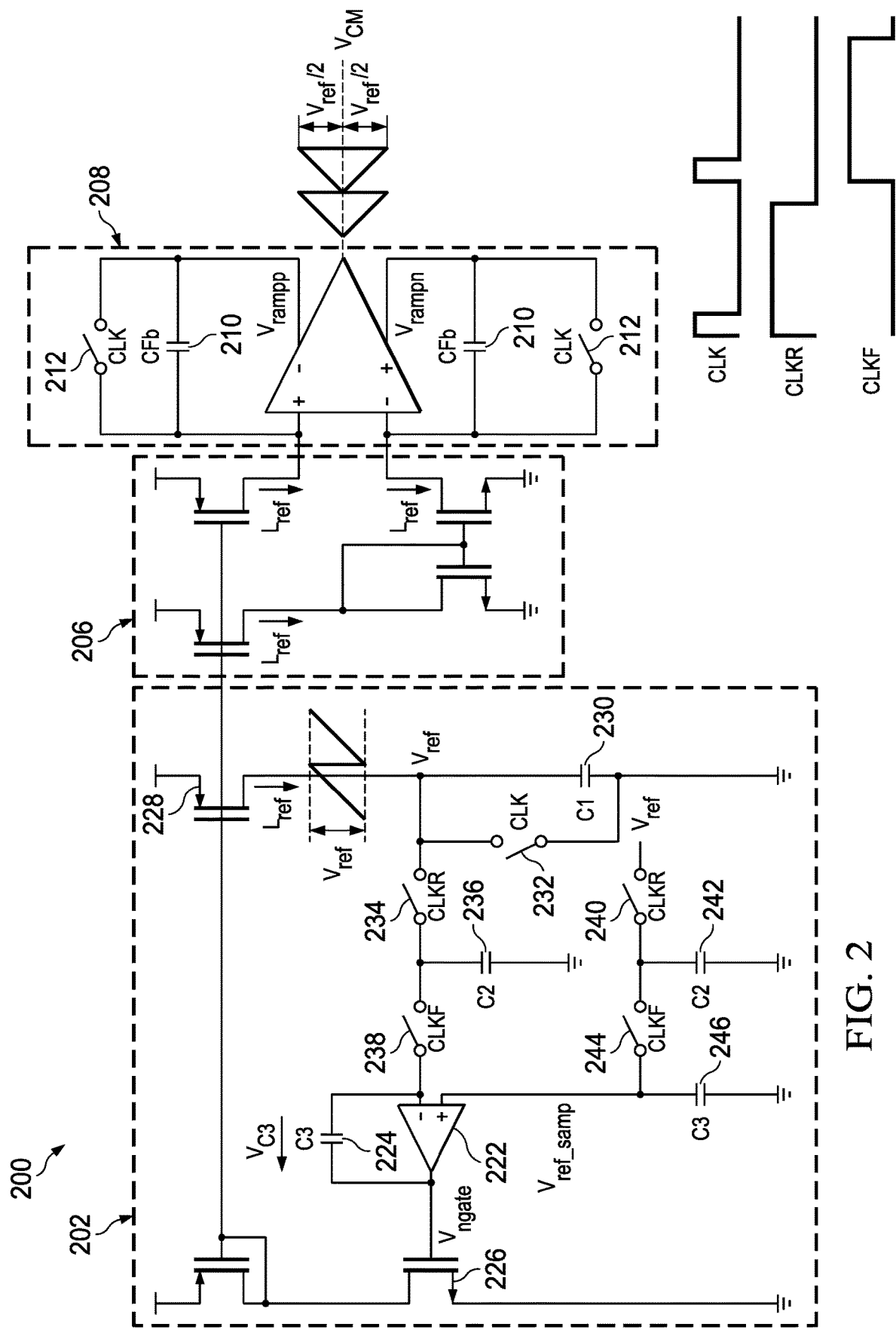
FIG. 2 illustrates an example ramp-generation circuit and example control waveforms for switches of the ramp-generation circuit, in accordance with embodiments of the present disclosure.

FIG. 2 illustrates an example ramp-generation circuit 200 and example control waveforms for switches of ramp-generation circuit 200, in accordance with embodiments of the present disclosure. As shown in FIG. 2, ramp-generation circuit 200 may include a reference-current generation subcircuit 202 for generating a reference current $I_{ref}$. Ramp-generation circuit 200 may also include a current-mirror stage 206 that sources an amplifier input current proportional to reference current $I_{ref}$ to a positive input terminal of an output amplifier stage 208 and sinks an amplifier input current of identical magnitude from a negative input terminal of output amplifier stage 208. Such amplifier input currents may flow through feedback capacitors 210 of equal capacitance $C_{fb}$, integrating charge during each cycle of ramp-generation circuit 200 to generate, at each output terminal of output amplifier stage 208, a sawtooth ramp signal, which is reset to its minimum voltage (e.g., zero) during each cycle boundary of ramp-generation circuit 200 as a result of periodic activation of switches 212 by clock signal CLK.

As shown in FIG. 2, reference-current generation subcircuit 202 may include an amplifier 222 having a feedback capacitor 224 with a capacitance $C_3$ coupled between an output of amplifier 222 and a negative input terminal of amplifier 222. Amplifier 222 may drive at its output a voltage $V_{ngate}$, that drives an n-type field-effect transistor 226 which effectively acts as a current source, mirroring reference current $I_{ref}$ through a p-type field effect transistor 228 which also effectively acts as a current source. Reference current $I_{ref}$ through p-type field effect transistor 228 may integrate charge on capacitor 230 having capacitance $C_1$, generating across capacitor 230 a sawtooth ramp voltage signal $V_{res}$ having a maximum voltage equal to reference voltage $V_{ref}$ (described below) and which is reset to its minimum voltage (e.g., zero) during each cycle boundary of ramp-generation circuit 200 as a result of periodic activation of switch 232 by clock signal CLK. The electrical node having sawtooth ramp voltage signal $V_{res}$ may be coupled via a switch 234 to a first terminal of a capacitor 236 with capacitance $C_2$ and having its second terminal coupled to a ground voltage. The first terminal of capacitor 236 may also be coupled to the negative input terminal of amplifier 222 via a switch 238.

Also as shown in FIG. 2, a reference voltage $V_{ref}$ may be coupled via a switch 240 to a first terminal of a capacitor 242 with capacitance $C_2$ and having its second terminal coupled to a ground voltage. The first terminal of capacitor 242 may also be coupled to the positive input terminal of amplifier 222 via a switch 244. In addition, a capacitor 246 with capacitance $C_3$ may be coupled between the positive input terminal of amplifier 222 and a ground voltage.

As shown by control waveforms of FIG. 2, control signals CLKR and CLKF may be substantially complementary to each other, and each may activate their respective controlled switches during alternating cycles of ramp-generation circuit 200.

In operation, when control signal CLKR is asserted and control signal CLKF is deasserted, voltage $V_{res}$ may increase from zero to reference voltage $V_{ref}$ as reference current $I_{ref}$ charges on capacitors 230 and 236. When control signal CLKF is asserted and control signal CLKR is deasserted, the difference between voltage $V_{res}$ and reference voltage $V_{ref}$ may be integrated onto feedback capacitor 224, which controls the gate of current source n-type field-effect transistor 226 to generate reference current $I_{ref}$ which is in turn mirrored through current source p-type field-effect transistor 228.

At the time control signal CLKR deasserts, voltage $V_{res}$ may be given by:

$$V_{res} = \frac{I_{ref}}{(C_1 + C_2)f}$$

wherein f equals a frequency of operation (e.g., the frequency of control signal CLK).

Using principles of charge conservation:

$$V_{C3}(n) = V_{C3}(n-1) + \frac{C_2}{C_3}(V_{ref\_samp} - V_{res}), \text{ and}$$

$$V_{ngate}(n) = V_{C3}(n) + V_{ref\_samp}$$

wherein $V_{C3}$ is a voltage across feedback capacitor 224, and $V_{ref\_samp}$ is a sampled reference voltage at the positive input terminal of amplifier 222 (e.g., the voltage across capacitor 246).

Accordingly, reference-current generation subcircuit 202 provides a closed control loop that sets voltage $V_{res}$ equal to reference voltage $V_{ref}$ and equal to sampled reference voltage $V_{ref\_samp}$.

If capacitance $C_{fb}=2(C_1+C_2)$, then reference current $I_{ref}$ may be set to a magnitude which may be sufficient to charge feedback capacitors 210 to a differential voltage equal to reference voltage $V_{ref}$.

Accordingly, the foregoing discussion discloses a system comprising a ramp generation circuit (e.g., amplifier stage 208) for generating a ramp waveform and comprising a first passive circuit element having an impedance pertinent to generation of the ramp waveform (e.g., one or both of feedback capacitors 210) and a control circuit (e.g., reference-current generation subcircuit 202) comprising a second passive circuit element which is impedance-correlated to the first passive circuit element (e.g., one or more of capacitors 230, 236, 242). The control circuit may be configured to use the second passive circuit element to generate a control signal (e.g., voltages $V_{res}$ and $V_{ref\_samp}$) for controlling the ramp generation circuit, such that a correlation between the first passive circuit element and the second passive circuit element substantially cancels physical variations (e.g., one or more of a process variation, a temperature variation, and a voltage supply variation) of the first passive circuit element and the second passive circuit element. The control circuit may also use a control signal clock (e.g., control signals CLKR, CLKF) for generating the control signal that is related to a ramp generation clock (e.g., control signal CLK) for generating the ramp waveform such that a magnitude of the ramp waveform remains substantially independent of frequency of operation.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
  a ramp generation circuit for generating a ramp waveform and comprising a first passive circuit element having an impedance pertinent to generation of the ramp waveform; and
  a control circuit comprising a second passive circuit element which is impedance-correlated to the first passive circuit element, wherein the control circuit is configured to:
    use the second passive circuit element to generate a control signal for controlling the ramp generation circuit, such that a correlation between the first passive circuit element and the second passive circuit element substantially cancels physical variations of the first passive circuit element and the second passive circuit element; and
    use a control signal clock for generating the control signal that is related to a ramp generation clock for generating the ramp waveform such that a magnitude of the ramp waveform remains substantially independent of frequency of operation.

2. The system of claim 1, wherein the physical variations comprise at least a process variation.

3. The system of claim 1, wherein the physical variations comprise at least a temperature variation.

4. The system of claim 1, wherein the physical variations comprise at least a voltage supply variation.

5. The system of claim 1, wherein the first passive circuit element comprises a first capacitor and the second passive circuit element is a second capacitor integral to a switched capacitor filter.

6. A method comprising:
  generating a ramp waveform with a ramp generation circuit, the ramp generation circuit comprising a first passive circuit element having an impedance pertinent to generation of the ramp waveform;
  using a second passive circuit element which is impedance-correlated to the first passive circuit element to generate a control signal for controlling the ramp generation circuit, such that a correlation between the first passive circuit element and the second passive circuit element substantially cancels physical variations of the first passive circuit element and the second passive circuit element; and
  using a control signal clock for generating the control signal that is related to a ramp generation clock for generating the ramp waveform such that a magnitude of the ramp waveform remains substantially independent of frequency of operation.

7. The method of claim 6, wherein the physical variations comprise at least a process variation.

8. The method of claim 6, wherein the physical variations comprise at least a temperature variation.

9. The method of claim 6, wherein the physical variations comprise at least a voltage supply variation.

10. The method of claim 6, wherein the first passive circuit element comprises a first capacitor and the second passive circuit element is a second capacitor integral to a switched capacitor filter.

* * * * *